United States Patent
Lee et al.

(10) Patent No.: US 10,290,628 B2
(45) Date of Patent: May 14, 2019

(54) ELECTROSTATIC DISCHARGE PROTECTION CIRCUIT

(71) Applicant: Shenzhen Goodix Technology Co., Ltd., Shenzhen, Guangdong (CN)

(72) Inventors: Tsung-Lung Lee, Guangdong (CN); Fu-Chiang Yang, Guangdong (CN)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/950,126

(22) Filed: Apr. 10, 2018

(65) Prior Publication Data

US 2018/0226395 A1 Aug. 9, 2018

Related U.S. Application Data

(63) Continuation of application No. PCT/CN2016/100118, filed on Sep. 26, 2016.

(51) Int. Cl.
*H02H 9/04* (2006.01)
*H01L 27/02* (2006.01)

(52) U.S. Cl.
CPC ........ *H01L 27/0274* (2013.01); *H01L 27/027* (2013.01); *H02H 9/046* (2013.01)

(58) Field of Classification Search
CPC .... H01L 27/0274; H01L 27/027; H02H 9/046
See application file for complete search history.

(56) References Cited

U.S. PATENT DOCUMENTS

| | | | |
|---|---|---|---|
| 7,639,464 B1 | 12/2009 | Vashchenko | |
| 2007/0058306 A1 | 3/2007 | Poulton | |
| 2009/0225482 A1* | 9/2009 | Nakahara | H01L 27/0266 361/56 |
| 2014/0225156 A1 | 8/2014 | Zhan | |
| 2016/0141287 A1* | 5/2016 | He | H01L 27/0262 257/133 |

FOREIGN PATENT DOCUMENTS

| | | | | |
|---|---|---|---|---|
| CN | 103515374 | * | 1/2014 | ............ H01L 27/02 |
| WO | 2011/089179 A1 | | 7/2011 | |

OTHER PUBLICATIONS

Machine Translation of CN 103515374.*

* cited by examiner

*Primary Examiner* — Julia Slutsker
(74) *Attorney, Agent, or Firm* — Winston Hsu

(57) ABSTRACT

The present application belongs to field of integrated circuit and discloses an electrostatic discharge protection circuit comprising a first N-type transistor and a second N-type transistor. The first N-type transistor comprises a first gate terminal coupled to a ground terminal; a first electrode terminal coupled to the first gate terminal; and a second electrode terminal. The second N-type transistor comprises a second gate terminal coupled to a metal pad; a third electrode terminal coupled to the second gate terminal; a fourth electrode terminal, coupled to the second electrode terminal; and a first deep N well, disposed under the third electrode terminal and the fourth electrode terminal. The ESD protection circuits provided by the embodiments of the present application have advantages of small circuit area and good ESD protection.

14 Claims, 7 Drawing Sheets

ELECTROSTATIC DISCHARGE PROTECTION CIRCUIT

CROSS REFERENCE TO RELATED APPLICATIONS

The present application is a continuation of international application No. PCT/CN2016/100118, filed on Sep. 26, 2016, which is incorporated herein by reference in its entirety.

FIELD OF THE INVENTION

The present application belongs to field of integrated circuit, related to an electrostatic discharge protection circuit.

BACKGROUND

As electronic technology evolves, electronic devices are widely applied in all areas. Electronic devices are not only applied in high-tech industry area such as aerospace equipment, but also applied in consumer electronic products, such as home appliances, communication devices, and medical equipment. Electro static discharge (ESD) can be seen everywhere, and ESD problem is a threat to normal operation of the equipment. It is an issue of engineer's concern that how to prevent ESD such that the device operates normally. ESD is common in daily life, especially during the manufacturing, transporting, storing and using of the electronic device. When the electrostatic is accumulated to a certain level, energy of a certain degree would be released, which causes irreversible damage to the electronic device.

In addition, in order to bear positive voltage and negative voltage, the ESD protection circuit in the art usually includes a P-type transistor (PMOS) and an N-type transistor (NMOS). However, to achieve better conducting or current diverting effect, the P-type transistor has to occupy more circuit area.

SUMMARY

It is therefore a primary objective of embodiments of the present application to provide an ESD protection circuit with smaller circuit area.

To solve the problem stated in the above, the present application provides an ESD protection circuit, including a first N-type transistor including a first gate terminal coupled to a ground terminal; a first electrode terminal coupled to the first gate terminal; and a second electrode terminal; and a second N-type transistor including a second gate terminal coupled to a metal pad; a third electrode terminal coupled to the second gate terminal; a fourth electrode terminal coupled to the second electrode terminal; and a first deep N well disposed under the third electrode terminal and the fourth electrode terminal.

Moreover, the first N-type transistor further includes a first base terminal coupled to the first electrode terminal.

Moreover, the second N-type transistor further includes a first P-well, disposed between the third electrode terminal, the fourth electrode terminal and the first deep N-well.

Moreover, the second N-type transistor further includes a first N-well, and the first N-well is disposed by a side of the first P-well.

Moreover, the N-type region receives a supply voltage.

Moreover, the ESD protection circuit further includes a diode coupled to the second N-type transistor.

Moreover, the diode includes a first terminal coupled to the second N-type transistor; and a second terminal receiving a supply voltage.

Moreover, the diode further includes a second N-well disposed under the first terminal and the second terminal.

Moreover, the diode includes a second P-well, disposed under the first terminal and the second terminal Moreover, the diode includes a second deep N-well, disposed under the second P-well.

Moreover, the ESD protection circuit further includes a plurality of diodes which forms a diode series; wherein an end of the diode series is coupled to the second N-type transistor, and another end of the diode series receives a supply voltage.

Moreover, when a voltage of the metal pad is a positive ESD voltage, a first current flows to the ground terminal through the first N-type transistor.

Moreover, when a voltage of the metal pad is a positive ESD voltage, the first N-type transistor is formed as a first bipolar transistor.

Moreover, when a voltage of the metal pad is a negative ESD voltage, a second current flows to the metal pad through the second N-type transistor.

Moreover, when a voltage of the metal pad is a negative ESD voltage, the second N-type transistor is formed as a second bipolar transistor.

The present application utilizes the N-type transistor including the deep N-well to reduce the circuit area of the ESD protection circuit and to provide an additional current diverting path for electrostatic discharge bombardment (ESD Zap). The ESD protection circuit of the present application may have advantages of small circuit area and good ESD protection.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
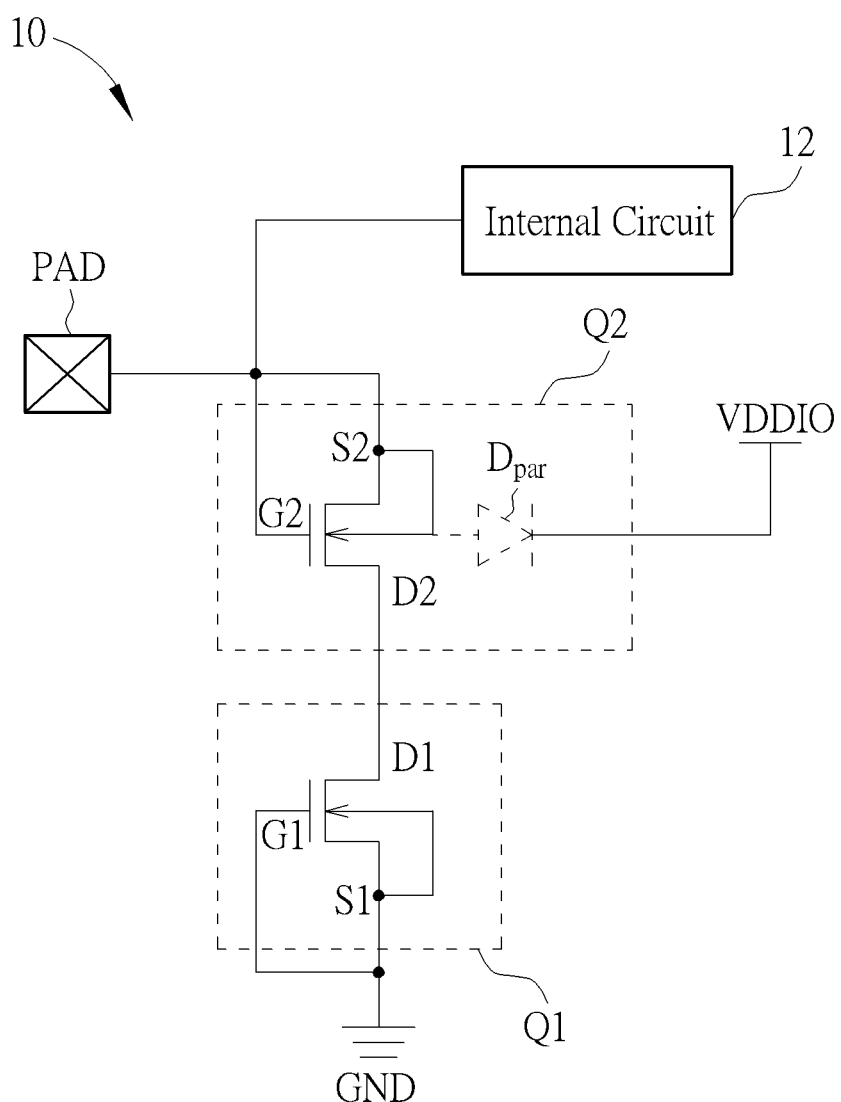
FIG. 1 is a schematic diagram of an electrostatic discharge (ESD) protection circuit according to an embodiment of the present application.
Figure 2:
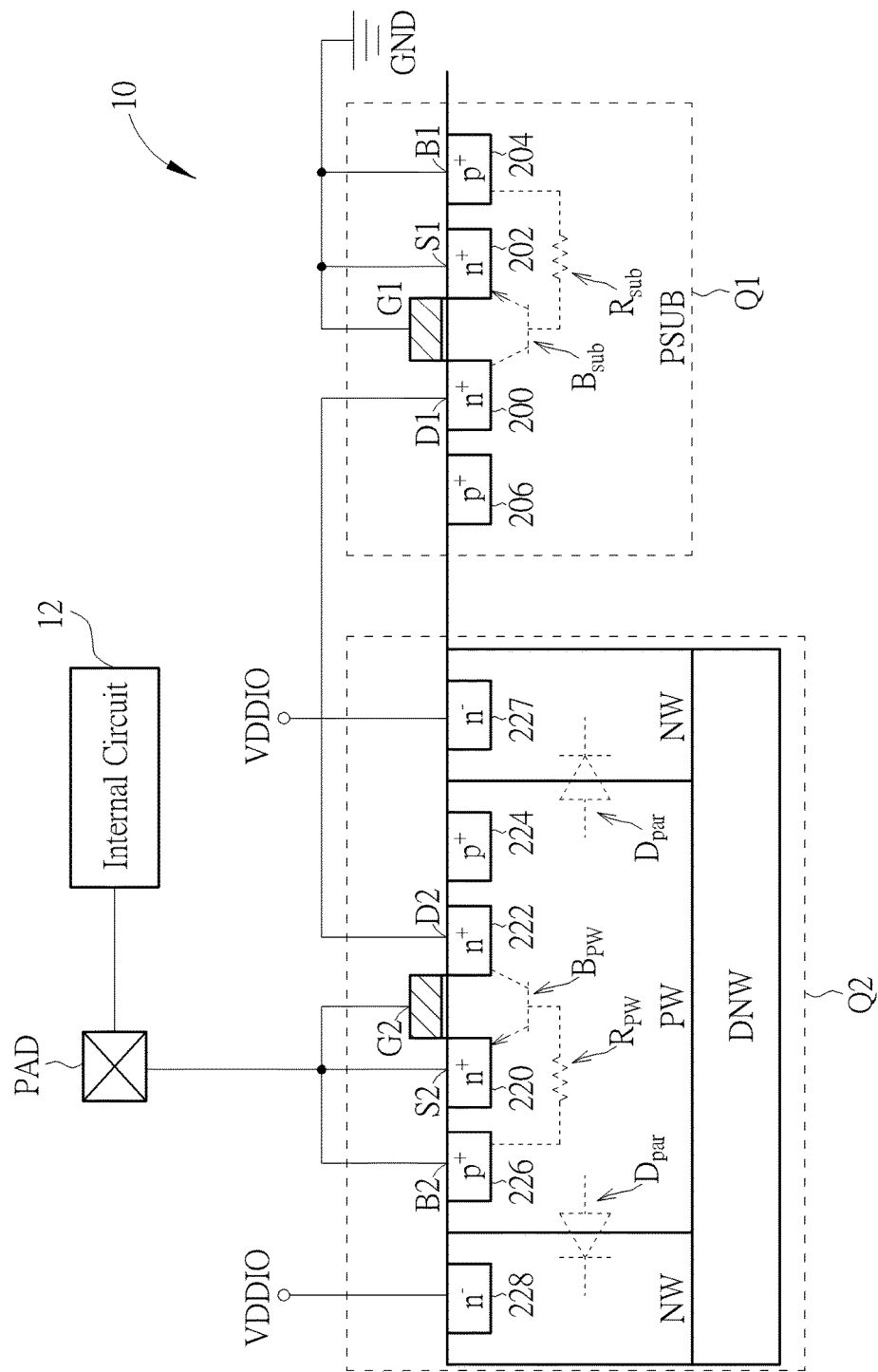
FIG. 2 is a sectional side view of circuit layout regarding the ESD protection circuit illustrated in FIG. 1.

Please refer to FIG. 1 and FIG. 2. FIG. 1 is a schematic diagram of an electrostatic discharge (ESD) protection circuit 10 according to an embodiment of the present invention. FIG. 2 is a sectional side view of circuit layout regarding the ESD protection circuit 10. The ESD protection circuit 10 includes a first N-type transistor Q1 and a second N-type transistor Q2. The first N-type transistor Q1 includes a gate terminal G1 and electrode terminals S1 and D1. The second N-type transistor Q2 includes a gate terminal G2 and electrode terminals S2 and D2. The gate terminal G1 and the electrode terminal S1 are coupled to a ground terminal GND. The gate terminal G2 and the electrode terminal S2 are coupled to a metal pad PAD. The electrode terminal D1 of the first N-type transistor Q1 is coupled to the electrode terminal D2 of the second N-type transistor.

Specifically, as shown in FIG. 2, the first N-type transistor Q1 is formed on a P-type substrate PSUB. That is, N-type regions 200 and 202 and P-type regions 204 and 206 are formed on the P-type substrate PSUB. The N-type region 200 may be formed as the electrode terminal D1 of the first N-type transistor Q1, and the N-type region 202 may be formed as the electrode terminal S1 of the first N-type transistor Q1. An oxide layer and a poly silicon layer, disposed between the N-type region 200 and the N-type region 202, are formed as the gate terminal G1 of the first N-type transistor Q1. In addition, the P-type region 204 may be formed as a base terminal B1 of the first N-type transistor Q1. The gate terminal G1, the electrode terminal S1 and the base terminal B1 of the first N-type transistor Q1 are all electrically connected to the ground terminal GND.

In addition, the second N-type transistor Q2 includes a deep N-well DNW, a P-well PW, N-wells NW, N-type regions 220, 222, 227 and 228 and P-type regions 224 and 226. The P-well PW and the N-wells NW are both formed on the deep N-well DNW. The N-wells NW are disposed by two sides of the P-well PW. The N-type regions 220 and 222 and the P-type regions 224 and 226 are formed on the P-well PW. The N-type regions 227 and 228 are formed on the N-wells NW. Similarly, the N-type region 220 may be formed as the electrode terminal S2 of the second N-type transistor Q2, and the N-type region 222 may be formed as the electrode terminal D2 of the second N-type transistor Q2. An oxide layer and a poly silicon layer, disposed between the N-type region 220 and the N-type region 222, are formed as the gate terminal G2 of the second N-type transistor Q2. In addition, the P-type region 226 may be formed as a base terminal B2 of the second N-type transistor Q2. The gate terminal G2, the electrode terminal S2 and the base terminal B2 of the second N-type transistor Q2 are all electrically connected to the metal pad PAD. In addition, the N-type region 227 and 228 may receive a supply voltage VDDIO.

In addition, an internal circuit 12, protected by the ESD protection circuit 10, is coupled to the metal pad PAD, where the metal pad PAD, the ESD protection circuit 10 and the internal circuit 12 may be integrated in an integrated circuit (IC). Under a normal operation condition, i.e., when a voltage difference between the metal pad PAD and the ground terminal GND is substantially the supply voltage VDDIO of the IC, a loop from the metal pad PAD to the ground terminal GND is cutoff. When an extremely high voltage exists between the metal pad PAD and the ground terminal GND, e.g., ESD Zap, or during ESD testing, a current path through the ESD protection circuit 10 from the metal pad PAD to the ground terminal GND may be formed, which means that the loop from the metal pad PAD to the ground terminal GND is conducted, so as to prevent the extremely high voltage and current produced therefrom to impact the internal circuit 12, e.g., damaging the internal circuit 12.

Specifically, under the condition of normal operation, when a metal pad voltage $V_{PAD}$ of the metal pad PAD is substantially the supply voltage VDDIO, the second N-type transistor Q2 is conducted and the first N-type transistor Q1 is cutoff. When the metal pad voltage $V_{PAD}$ is substantially negative of the supply voltage, i.e., −VDDIO, the second N-type transistor Q2 is cutoff and the first N-type transistor Q1 is conducted. In other words, under the condition of normal operating between the positive voltage and the negative voltage, the loop between the metal pad PAD and the ground terminal GND is cutoff.

On the other hand, when ESD Zap occurs or it is during ESD testing, the first N-type transistor Q1, or the second N-type transistor Q2 can be equivalent to a bipolar transistor and the current path is formed, which is to prevent the internal circuit 12 from being damaged. Specifically, when the metal pad voltage $V_{PAD}$ is provided as a positive ESD voltage, e.g., VPAD=2 kilovolt (KV), the second N-type transistor Q2 is conducted, and the P-type substrate PSUB and the N-type regions 200 and 202 of the first N-type transistor Q1 form a bipolar transistor $B_{sub}$ and an equivalent resistor $R_{sub}$. Hence, a current may flow from the metal pad PAD to the ground terminal GND. On the other hand, when the metal pad voltage $V_{PAD}$ is provided as a negative ESD voltage, e.g., VPAD=−2 KV, the first N-type transistor Q1 is conducted, and the P-well PW and the N-type regions 220 and 222 of the second N-type transistor Q2 form a bipolar transistor $B_{PW}$ and an equivalent resistance $R_{PW}$. Hence, a current may flow from the ground terminal GND to the metal pad PAD. In other words, when there is an extremely high voltage existing between the metal pad PAD and the ground terminal GND, the originally cutoff first N-type transistor Q1 (or the originally cutoff second N-type transistor Q2) may form as the bipolar transistor $B_{sub}$ (or the bipolar transistor $B_{PW}$), and the current path between the metal pad PAD and the ground terminal GND is formed, such that the loop through the metal pad PAD and the ground terminal GND is conducted in time, so as to prevent excessive current flowing to the internal circuit 12 and damaging the internal circuit 12.

Notably, the ESD protection circuit 10 may be the ESD protection circuit which is able to bear positive voltage and negative voltage. In the prior art, the ESD protection circuit able to bear positive voltage and negative voltage includes a P-type transistor and an N-type transistor. Since the P-type transistor is conducted through electron holes and the electron holes has worse mobility, a larger circuit area for the P-type transistor is required for better conducting or current diverting effect. In comparison, the transistor Q2 of the ESD protection circuit 10 is N-type transistor, which is formed on the deep N-well DNW. In other words, the current flowing through the second N-type transistor Q2 is conducted via electrons instead of electron holes, which has better mobility. Therefore, the second N-type transistor Q2 does not have to require too much circuit area and would achieve good conducting or current diverting effect. In another perspective, a junction between the P-well PW and the N-well NW may form a parasitic diode $D_{par}$. When the metal pad voltage $V_{PAD}$ is larger than the supply voltage VDDIO, more precisely speaking, when the metal pad voltage $V_{PAD}$ is larger than the supply voltage VDDIO plus a conducting voltage $V_D$ corresponding to the parasitic diode $D_{par}$ ($V_{PAD}$>VDDIO+$V_D$), the junction between the P-well PW and the N-well NW may form a forward bias, which is equivalent to the parasitic diode $D_{par}$ being conducted and forming a diverting current from the P-well PW to the N-well NW. In other words, compared to the prior art, the ESD protection circuit 10 occupies less circuit area. In addition, when the metal pad voltage $V_{PAD}$ is too large, the ESD protection circuit 10 may further form the diverting current from the P-well PW to the N-wells NW, and the current flowing to the internal circuit 12 during ESD Zap or ESD testing is reduced, to enhance an effect of ESD protection.

Figure 3:
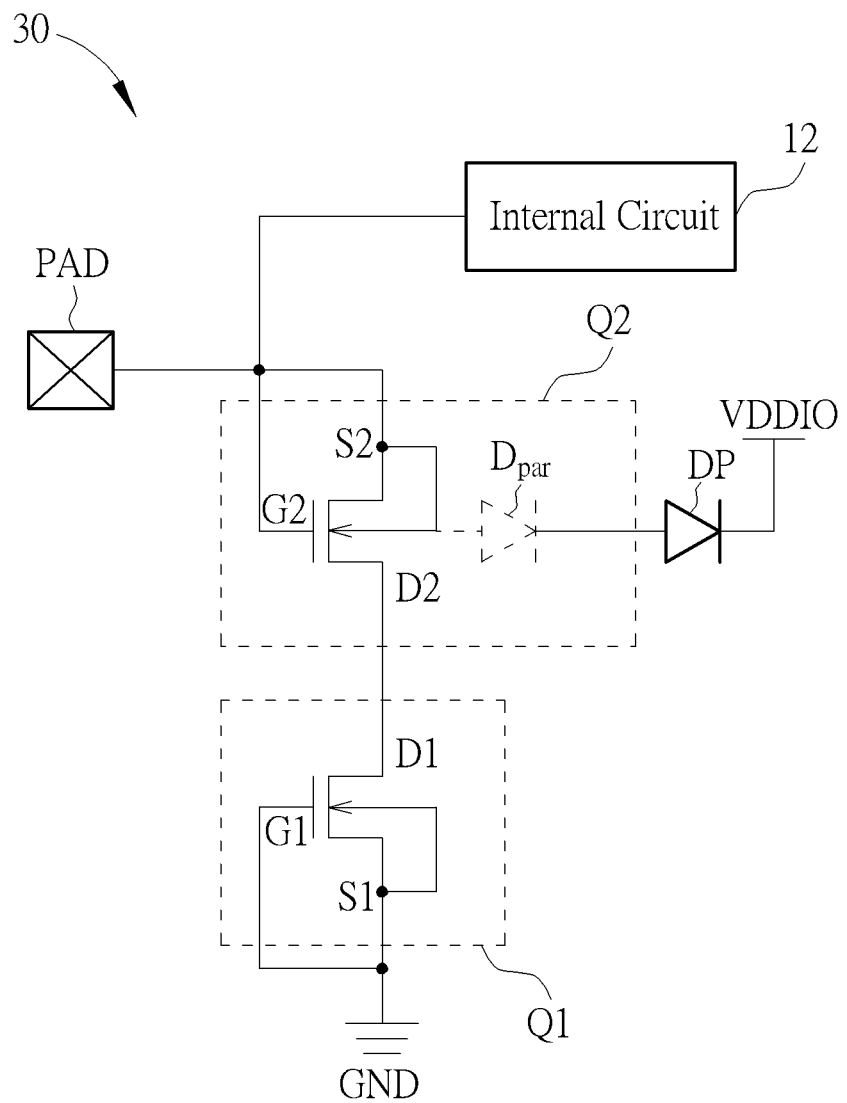
FIG. 3 is a schematic diagram of an ESD protection circuit according to another embodiment of the present application.
Figure 4:
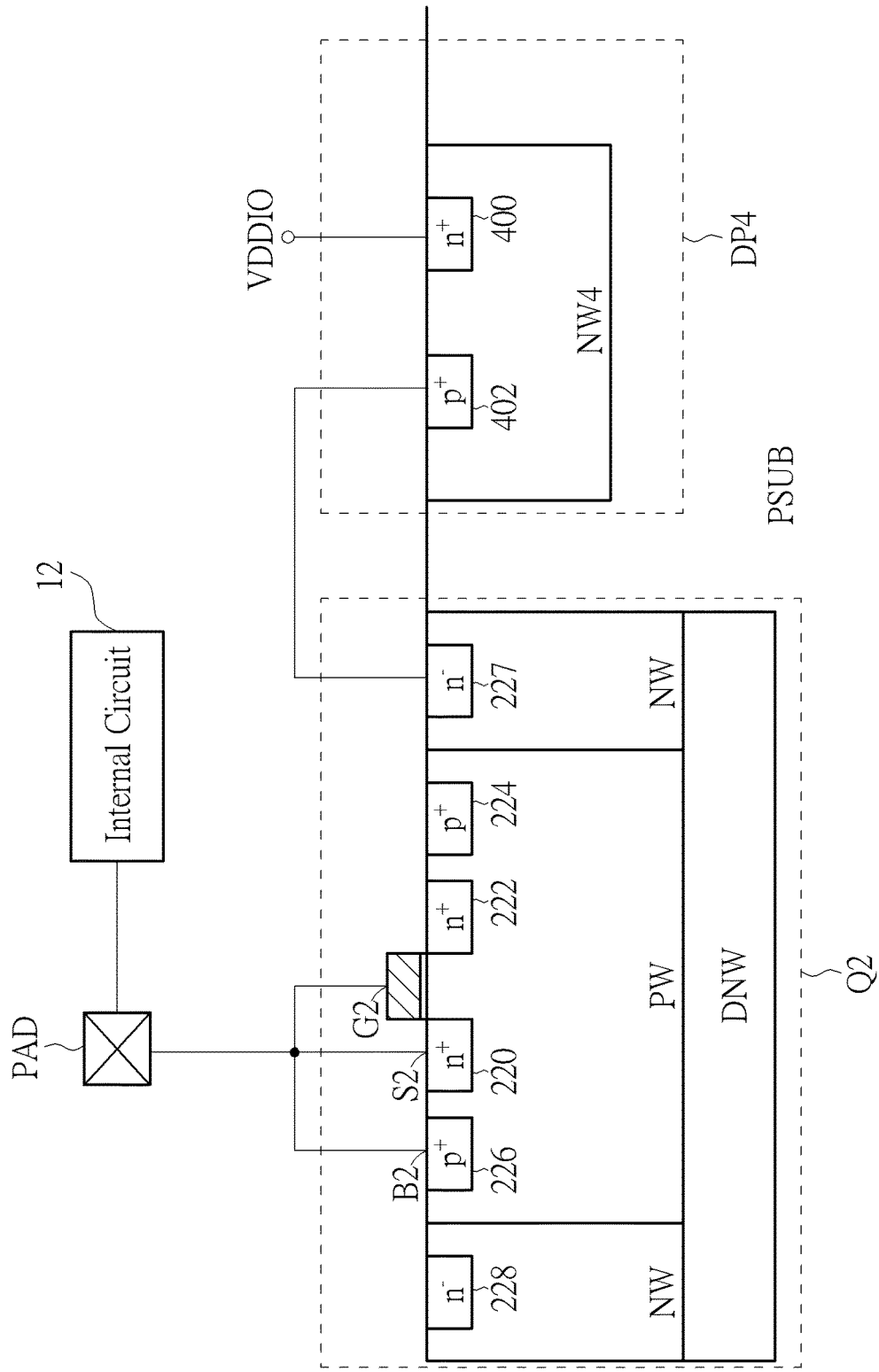
FIG. 4 is a sectional side view of circuit layout regarding a second N-type transistor and a diode of the ESD protection circuit illustrated in FIG. 3.
Figure 5:
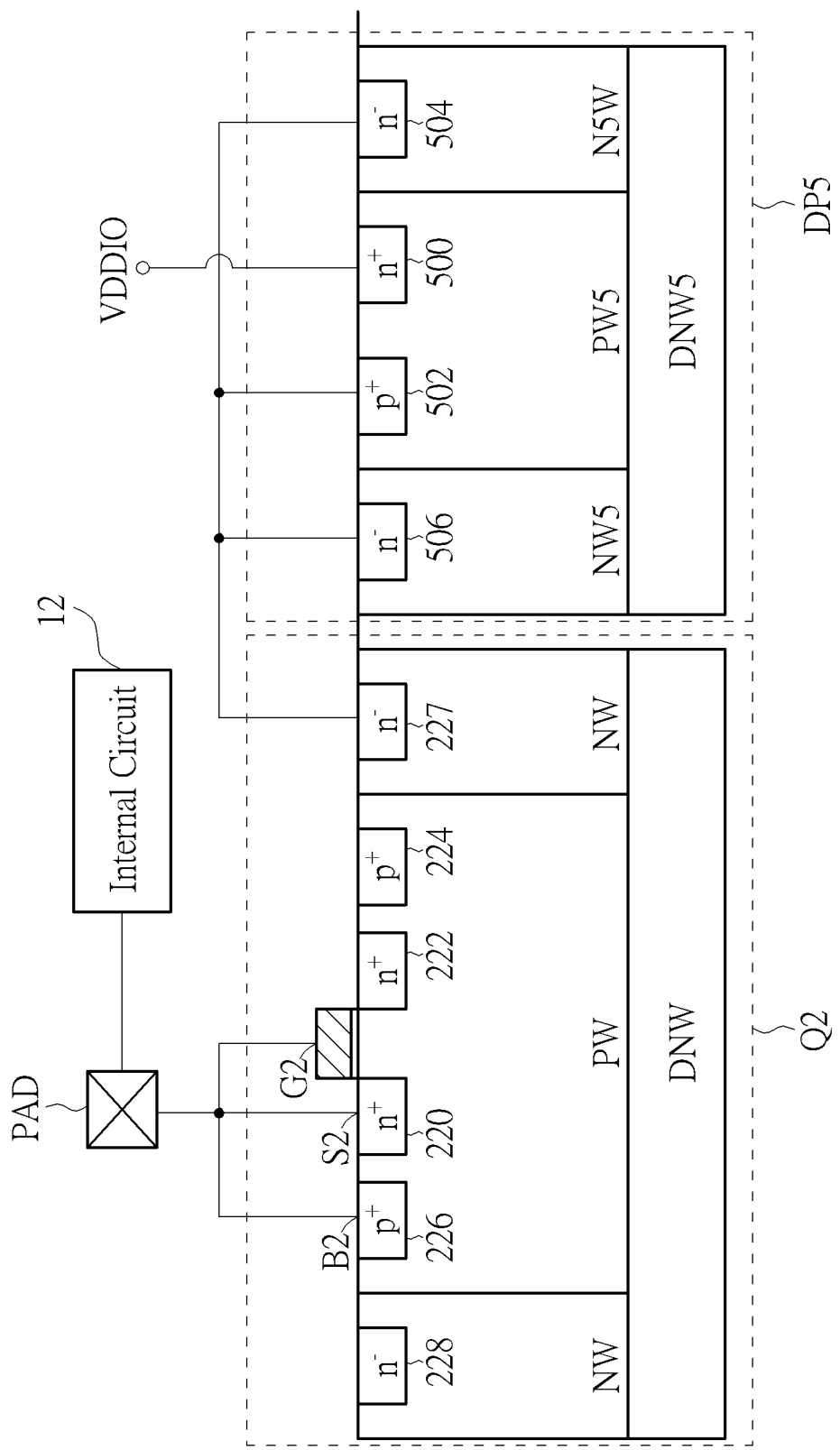
FIG. 5 is a sectional side view of circuit layout regarding another example of the second N-type transistor and the diode of the ESD protection circuit illustrated in FIG. 3.

Notably, the embodiments stated in the above are utilized for illustrating the concept of the present application. Those skilled in the art may make modifications and alterations accordingly, and not limited herein. For example, please refer to FIG. 3, which is a schematic diagram of an ESD protection circuit 30 according to another embodiment of the present application. The ESD protection circuit 30 is similar to the ESD protection circuit 10, and thus, the same components are denoted by the same notations. Different from the ESD protection circuit 10, the ESD protection circuit 30 further includes a diode DP. A terminal of the diode DP is electrically connected to the N-type region 227 of the second N-type transistor Q2, and the other terminal of the diode DP receives the supply voltage VDDIO. When the metal pad voltage $V_{PAD}$ is negative, the diode DP may be utilized to prevent junction breakdown between the N-well NW and the P-well PW, or between the deep N-well DNW and the P-well PW, of the second N-type transistor Q2. Please refer to FIG. 4 for more detailed connection between the second N-type transistor Q2 and the diode DP. FIG. 4 is a sectional side view of circuit layout regarding the second N-type transistor Q2 and a diode DP4. The diode DP4 may be utilized as an example of the diode DP in FIG. 3. As shown in FIG. 4, the diode DP4 may be formed in the P-type substrate PSUB. The diode DP4 includes an N-well NW4, an N-type region 400 and a P-type region 402, where the N-type region 400 and the P-type region 402 are formed in the N-well NW4. The N-type region 400 is configured to receive the supply voltage VDDIO, and the P-type region 402 is electrically connected to the N-type region 227 of the second N-type transistor Q2. In addition, the diode DP in FIG. 3 is not limited to be realized by using the diode DP4 in FIG. 4. For example, please refer to FIG. 5, which is a sectional side view of circuit layout regarding the second N-type transistor Q2 and a diode DP5. The diode DP5 may also be utilized to realize the diode DP in FIG. 3. Different from the diode DP4, the diode DP5 includes a deep N-well DNW5, a P-well PW5, an N-well NW5, N-type regions 500, 504 and 506 and a P-type region 502. The P-well PW5 and the N-well NW5 are both formed on the deep N-well DNW5. The N-wells NW5 are disposed by two sides of the P-well PW5. In addition, the N-type region 500 and the P-type region 502 are formed on the P-well PW5. The N-type regions 504 and 506 are formed on the N-well NW5. The N-type regions 504 and 506 and the P-type region 502 are electrically connected to the N-type region 227 of the second N-type transistor Q2. The N-type region 500 is configured to receive the supply voltage VDDIO.

Figure 6:
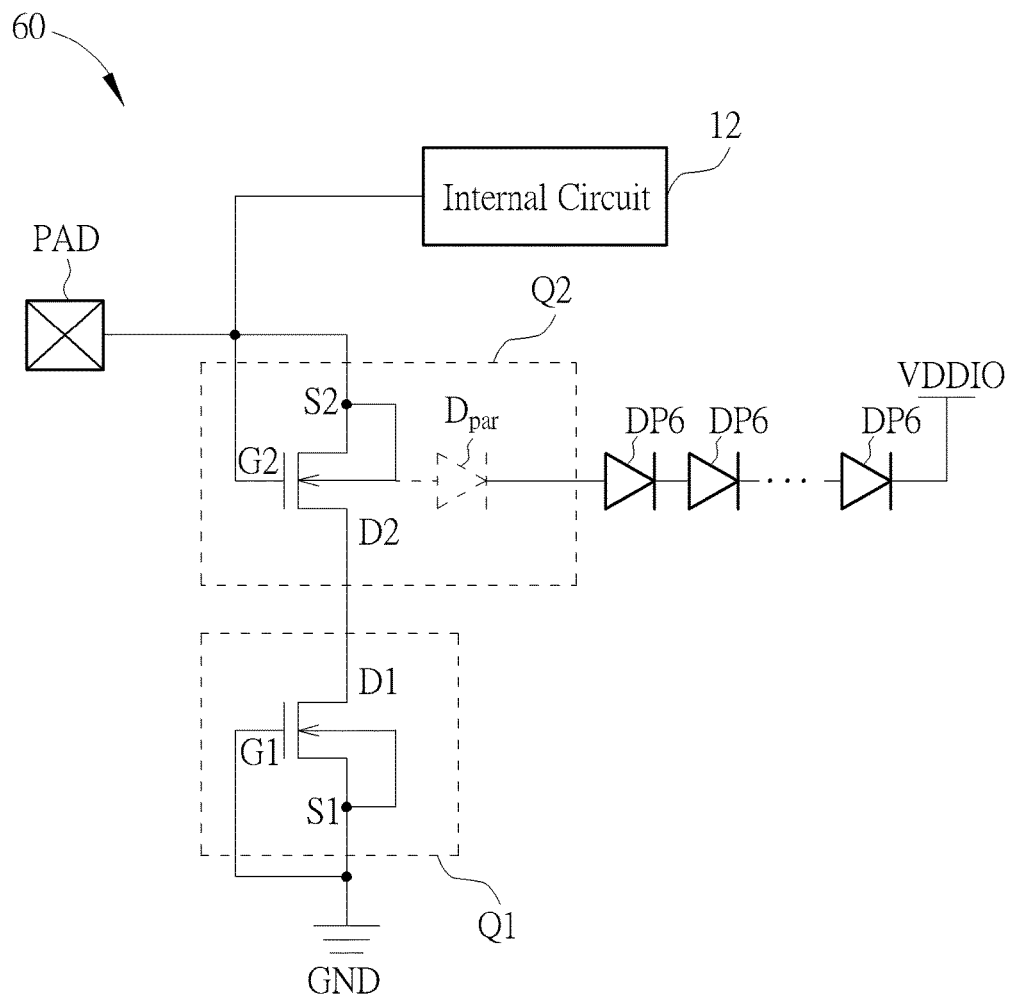
FIG. 6 is a schematic diagram of an ESD protection circuit according to another embodiment of the present application.
Figure 7:
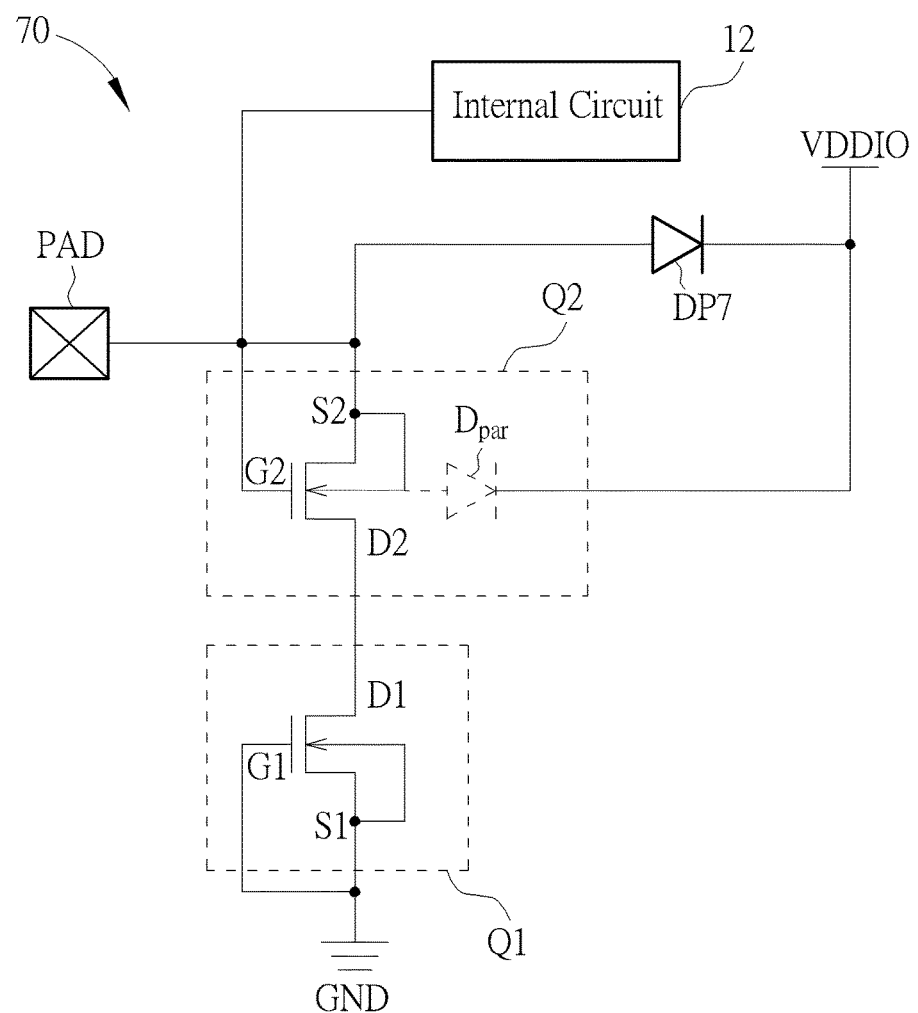
FIG. 7 is a schematic diagram of an ESD protection circuit according to another embodiment of the present application.

In addition, please refer to FIG. 6, which is a schematic diagram of an ESD protection circuit 60 according to still another embodiment of the present application. The ESD protection circuit 60 is similar to the ESD protection circuit 30, and thus, the same components are denoted by the same notations. Different from the ESD protection circuit 30, the ESD protection circuit 60 includes a plurality of diodes DP6. The plurality of diodes DP6 is connected in series to form as a diode series. An end of the diode series is electrically connected to the N-type region 227 of the second N-type transistor Q2, and the other end of the diode series receives the supply voltage VDDIO, which is also within the scope of the present application. In addition, please refer to FIG. 7, which is a schematic diagram of an ESD protection circuit 70 according to an embodiment of the present application. The ESD protection circuit 70 is similar to the ESD protection circuit 30, and thus, the same components are denoted by the same notations. Different from the ESD protection 30, the ESD protection circuit 70 includes a diode DP6. A terminal of the diode DP6 is electrically connected to the electrode terminal S2 of the second N-type transistor Q2, and the other terminal of the diode DP6 receives the supply voltage VDDIO, which is also within the scope of the present application.

In summary, the present application utilizes an N-type transistor including a deep N-well to reduce the circuit area of the ESD protection circuit. In addition, the N-type transistor comprising the deep N-well also provides the additional current diverting path for ESD Zap. Compared to prior art, the ESD protection circuit of the present application occupies less circuit area and has better ESD protection.

The foregoing is only embodiments of the present application, which is not intended to limit the present application. Any modification following the spirit and principle of the present application, equivalent substitutions, improvements should be included within the scope of the present application.

What is claimed is:

1. An electrostatic discharge (ESD) protection circuit, comprising:
   a first N-type transistor, comprising:
      a first gate terminal, coupled to a ground terminal;
      a first electrode terminal, coupled to the first gate terminal; and
      a second electrode terminal; and
   a second N-type transistor, comprising:
      a second gate terminal, coupled to a metal pad;
      a third electrode terminal, coupled to the second gate terminal;
      a fourth electrode terminal, coupled to the second electrode terminal;
      a first deep N well, disposed under the third electrode terminal and the fourth electrode terminal;
      a first P-well, disposed between the third electrode terminal, the fourth electrode terminal and the first deep N-well, wherein the second gate terminal, the third electrode terminal and the fourth electrode terminal are disposed on the first P-well;
      a first N-well, wherein the first N-well is disposed by a side of the first P-well; and
      a first N-type region, wherein the first N-type region is disposed in the first N-well, and the first N-type region is coupled to a voltage supplying circuit which provides a supply voltage.

2. The ESD protection circuit as claim 1, wherein the first N-type transistor further comprises:
   a first base terminal, coupled to the first electrode terminal.

3. The ESD protection circuit as claim 1, further comprising:
   a diode, coupled to the second N-type transistor.

4. The ESD protection circuit as claim 3, wherein the diode comprises:
   a first terminal, coupled to the second N-type transistor; and a second terminal, configured to receive the supply voltage.

5. The ESD protection circuit as claim 4, wherein the diode further comprises:
   a second N-well, disposed under the first terminal and the second terminal.

6. The ESD protection circuit as claim 4, wherein the diode further comprises:
   a second P-well, disposed under the first terminal and the second terminal.

7. The ESD protection circuit as claim 6, wherein the diode further comprises:
   a second deep N-well, disposed under the second P-well.

8. The ESD protection circuit as claim 1, further comprising:
   a plurality of diodes, formed as a diode series;
   wherein an end of the diode series is coupled to the second N-type transistor, the other end of the diode series is configured to receive the supply voltage.

9. The ESD protection circuit as claim 1, wherein a first current flows to the ground terminal through the first N-type transistor in response to a voltage of the metal pad being a positive ESD voltage.

10. The ESD protection circuit as claim 1, wherein the first N-type transistor is formed as a first bipolar transistor in response to a voltage of the metal pad being a positive ESD voltage.

11. The ESD protection circuit as claim 9, wherein the positive ESD voltage is larger than 1 kilovolt.

12. The ESD protection circuit as claim 1, wherein a second current flows to the metal pad through the second N-type transistor in response to a voltage of the metal pad being a negative ESD voltage.

13. The ESD protection circuit as claim 1, wherein the second N-type transistor is formed as a second bipolar transistor in response to a voltage of the metal pad being a negative ESD voltage.

14. The ESD protection circuit as claim 12, wherein the negative ESD voltage is less than negative 1 kilovolt.

* * * * *